(12) United States Patent
Lavine et al.

(10) Patent No.: US 7,776,638 B2
(45) Date of Patent: Aug. 17, 2010

(54) TWO EPITAXIAL LAYERS TO REDUCE CROSSTALK IN AN IMAGE SENSOR

(75) Inventors: James P. Lavine, Rochester, NY (US); Eric G. Stevens, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 12/247,248

(22) Filed: Oct. 8, 2008

(65) Prior Publication Data
US 2009/0035888 A1 Feb. 5, 2009

Related U.S. Application Data

(62) Division of application No. 11/686,540, filed on Mar. 15, 2007, now abandoned.

(60) Provisional application No. 60/869,431, filed on Dec. 11, 2006.

(51) Int. Cl.
*H01L 21/00* (2006.01)

(52) U.S. Cl. .............................. 438/48; 438/22; 438/59; 438/E27.13

(58) Field of Classification Search .............. 438/48–52, 438/22, 56–60; 257/49, 72, 171, 222, 232–233, 257/E27.13
See application file for complete search history.

(56) References Cited

U.S. PATENT DOCUMENTS

| 5,338,946 A | 8/1994 | Guidash |
| 2004/0211884 A1* | 10/2004 | Fang et al. ............... 250/214.1 |
| 2004/0222449 A1 | 11/2004 | Koyama |
| 2005/0087672 A1 | 4/2005 | Kuwazawa et al. |
| 2007/0045668 A1* | 3/2007 | Brady et al. ................. 257/219 |

FOREIGN PATENT DOCUMENTS

| EP | 0 809 299 | 11/1997 |
| EP | 1 128 437 | 8/2001 |
| WO | 02/27804 | 4/2002 |

* cited by examiner

*Primary Examiner*—Dung A. Le
(74) *Attorney, Agent, or Firm*—Nancy R. Simon

(57) ABSTRACT

An image sensor includes a substrate of a first conductivity type having an image area with a plurality of photosensitive sites, wherein a portion of the charge generated in response to light is collected in the pixel; and a subcollector of a second conductivity spanning the image area that collects another portion of the generated charge that would have otherwise diffused to adjacent photosensitive sites.

15 Claims, 3 Drawing Sheets

TWO EPITAXIAL LAYERS TO REDUCE CROSSTALK IN AN IMAGE SENSOR

CROSS REFERENCE TO RELATED APPLICATION

This is a divisional application of U.S. Ser. No. 11/686,540, filed Mar. 15, 2007 now abandoned which claims priority from U.S. Provisional Application Ser. No. 60/869,431, filed Dec. 11, 2006, entitled TWO EPITAXIAL LAYERS TO REDUCE CROSSTALK IN AN IMAGE SENSOR.

FIELD OF THE INVENTION

The invention relates generally to the field of image sensors and, more particularly, to an image sensor having two epitaxial layers to reduce crosstalk.

BACKGROUND OF THE INVENTION

Crosstalk results when a photogenerated carrier, say an electron, is generated beyond the depletion region beneath one photodiode or another photosensitive region, and the electron diffuses and/or drifts away and is collected by another photodiode or another photosensitive region. For clarity, photodiodes will be used as examples and the image sensor is assumed to be an array of pixels. Crosstalk by electrons reduces the modulation transfer function and mixes colors. Thus, it is desirable to reduce and/or eliminate such crosstalk.

Many image sensors based on charge-coupled devices (CCDs) are made in an n-epitaxial silicon layer on an n-type silicon substrate wafer. These imagers usually utilize a vertical overflow drain, which prevents electrons generated beyond the vertical overflow drain from reaching the photodiodes. Other image sensors are built in a p-epitaxial silicon layer on a heavily doped p-type silicon substrate. These p/p+ wafers are favored by silicon foundries for CMOS circuits. Thus, CMOS image sensors are usually made in p/p+ wafers to take advantage of the mainstream CMOS processes and circuits. Imagers made in p/p+ wafers lack the vertical overflow drain, so other methods have been tried. For example, U.S. Pat. No. 5,859,462, assigned to Eastman Kodak Company, teaches several crosstalk reduction schemes. Image sensor customers are presently demanding even more crosstalk reduction, so new approaches are needed. Various approaches have been tried with p/p+ wafers at CMOS foundries, but to date none has been sufficiently effective. Dongbu Electronics in U.S. Pat. No. 6,897,500 claims crosstalk reduction through an isolation layer surrounding each pixel. Such a structure consumes silicon area and is difficult to scale to smaller pixels. Thomson-CSF has patented a patterned subcollector method aimed at anti-blooming rather than crosstalk—U.S. Pat. Nos. 4,916,501 and 4,997,784. This approach is not as effective as the method proposed here and, in fact, part of the subcollector enhances the diffusion of electrons to other pixels. U.S. Pat. No. 6,225,670 suggests a method involving a potential barrier and lateral flow.

The present invention would reduce the number of photogenerated electrons that originate under one photodiode and diffuse and/or drift to another photodiode. This reduces the crosstalk. The invention introduces a buried n-doped region in a p-type epitaxial silicon layer on a p+ silicon substrate. The resulting pn junction is contacted and biased. A second p-type epitaxial silicon layer is deposited over the first p-epitaxial layer after the n-type dopant has been introduced. The pn junction collects the diffusing electrons and prevents them from reaching other photodiodes. The contact to the buried n-region is constructed within the second p-epitaxial layer. The CMOS circuits are built in the p-epitaxial/p-epitaxial/p+ substrate, i.e., the regions without the buried n-region, so the wafer is compatible with the standard CMOS offered by a foundry. In addition, this takes advantage of the excellent gettering of p/p+ substrates to reduce the metal concentrations in the device regions. The gettering lowers dark current and point defects.

SUMMARY OF THE INVENTION

The present invention is directed to overcoming one or more of the problems set forth above. Briefly summarized, according to one aspect of the present invention, the invention resides in an image sensor comprising (a) a substrate of a first conductivity type having an image area with a plurality of photosensitive sites, wherein a portion of the charge generated in response to light is collected in the pixel; and (b) a subcollector of a second conductivity spanning the image area that collects another portion of the generated charge that would have otherwise diffused to adjacent photosensitive sites.

These and other aspects, objects, features and advantages of the present invention will be more clearly understood and appreciated from a review of the following detailed description of the preferred embodiments and appended claims, and by reference to the accompanying drawings.

Advantageous Effect of the Invention

The present invention has the following advantage of reducing cross talk in an image sensor.

DETAILED DESCRIPTION OF THE INVENTION

Before discussing the present invention in detail, it is instructive to note that the present invention is preferably used in, but not limited to, a CMOS active pixel sensor. Active pixel sensor refers to an active electrical element within the pixel, other than transistors functioning as switches. For example, the amplifier is an active element. CMOS refers to complementary metal oxide silicon type electrical components such as transistors which are associated with the pixel, but typically not in the pixel, and which are formed when the source/drain of a transistor is of one dopant type and its mated transistor is of the opposite dopant type. CMOS devices include some advantages one of which is they consume less power.

In the preferred embodiment, the invention will be described having n-type and p-type dopings. It is to be understood that the type of doping for the various components could be reversed without departing from the scope of the invention.

Figure 1:
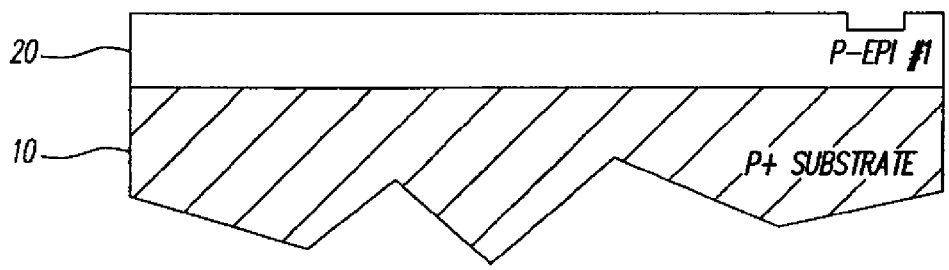
FIGS. 1-5 are cross sections of FIG. 6 illustrating a step in making the image sensor of the present invention.
Figure 2:
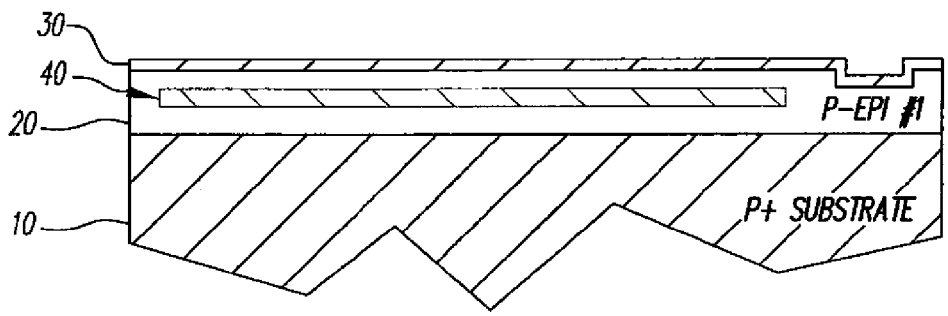
Figure 3:
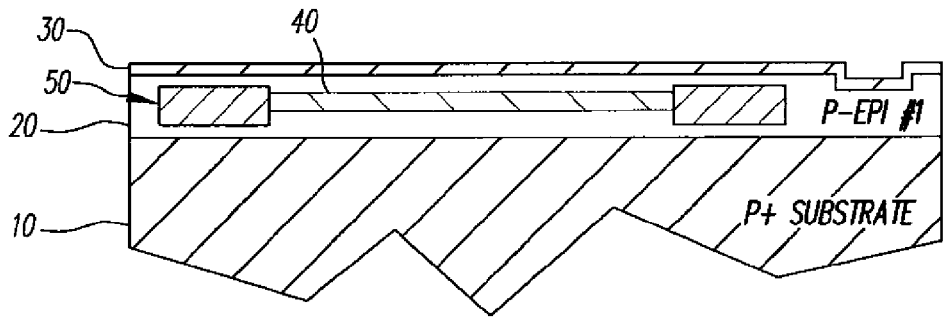
Figure 4:
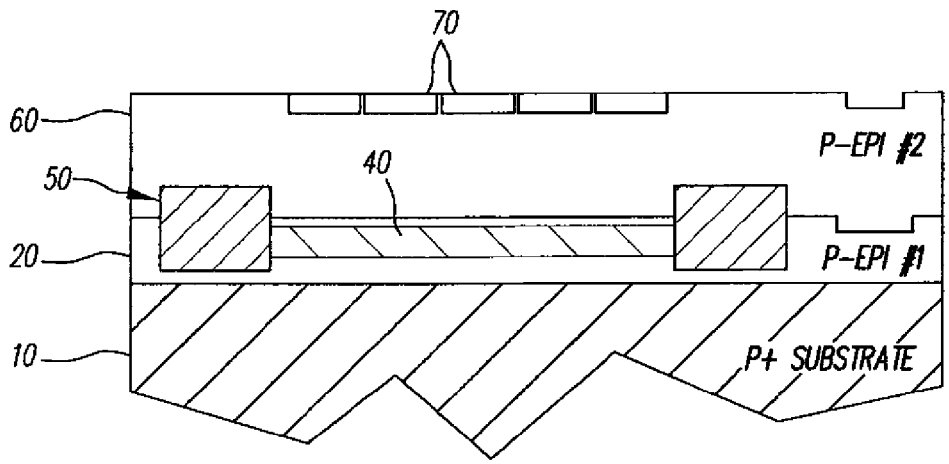
Figure 6:
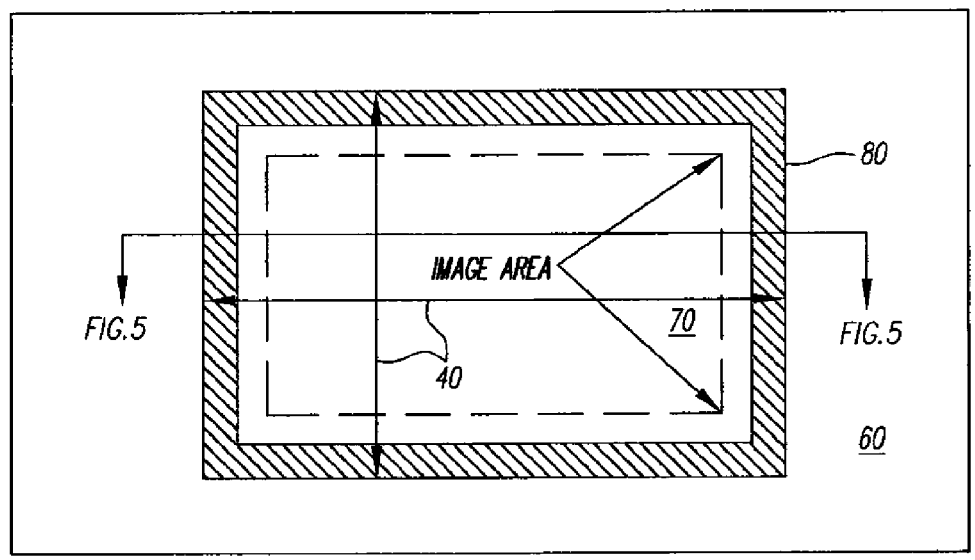
FIG. 6 is a top view of the image sensor of the present invention.

Referring to FIG. 1, there is shown a p-type substrate 10 having a first p-type epitaxial layer 20 formed on (spanning and directly on) the substrate 10. Referring to FIG. 2, a screening oxide layer 30 is deposited atop the epitaxial layer 20 and a subcollector 40, preferably either As or Sb (which is well known to be an n-type), is then implanted into the first epitaxial layer 20 through the screening oxide layer 30. Referring to FIGS. 3 and 6, subcollector contact region 50 (not shown in FIG. 6), preferably P (n-type), are implanted along the periphery of the subcollector region 40. The screening oxide layer 30 is then removed, and referring to FIGS. 4 and 6, a second epitaxial layer 60 is grown on the first epitaxial layer 20. It is noted that the subcollector 40 and subcollector contact region 50 diffuse at different rates wherein the subcollector contact region 50 diffuse at a faster rate than the subcollector region 40. This is illustrated by the increased size of these regions from FIG. 3. A plurality of photosensitive sites 70 (n type), preferably photodiodes or photocapacitors in the case of a CCD or CMOS image sensor, are implanted into the second epitaxial layer 60. It is noted that the subcollector 40 is at a depth deeper than the photosensitive sites 70. It is noted that the photosensitive sites 70 may be implanted at this stage of the process or at some later point in the process.

Figure 5:
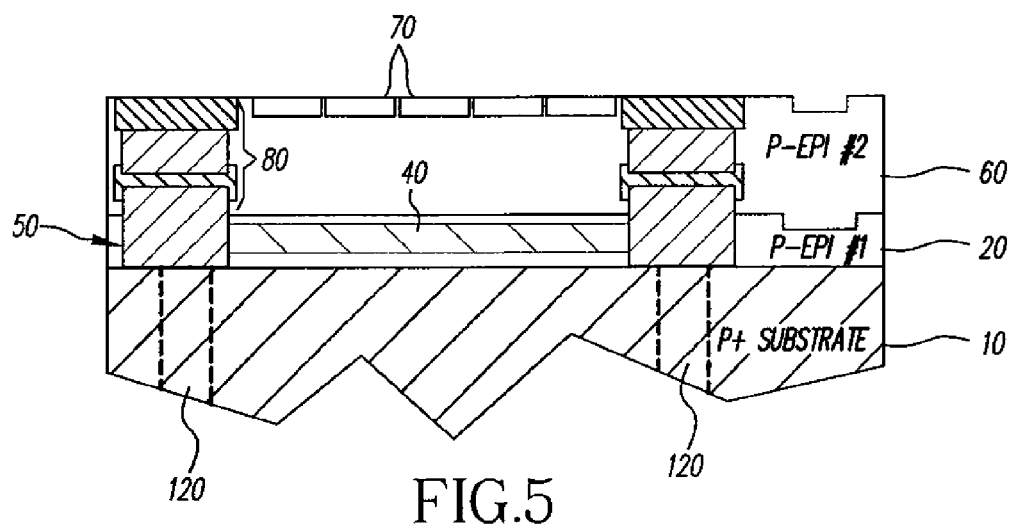
Figure 7:
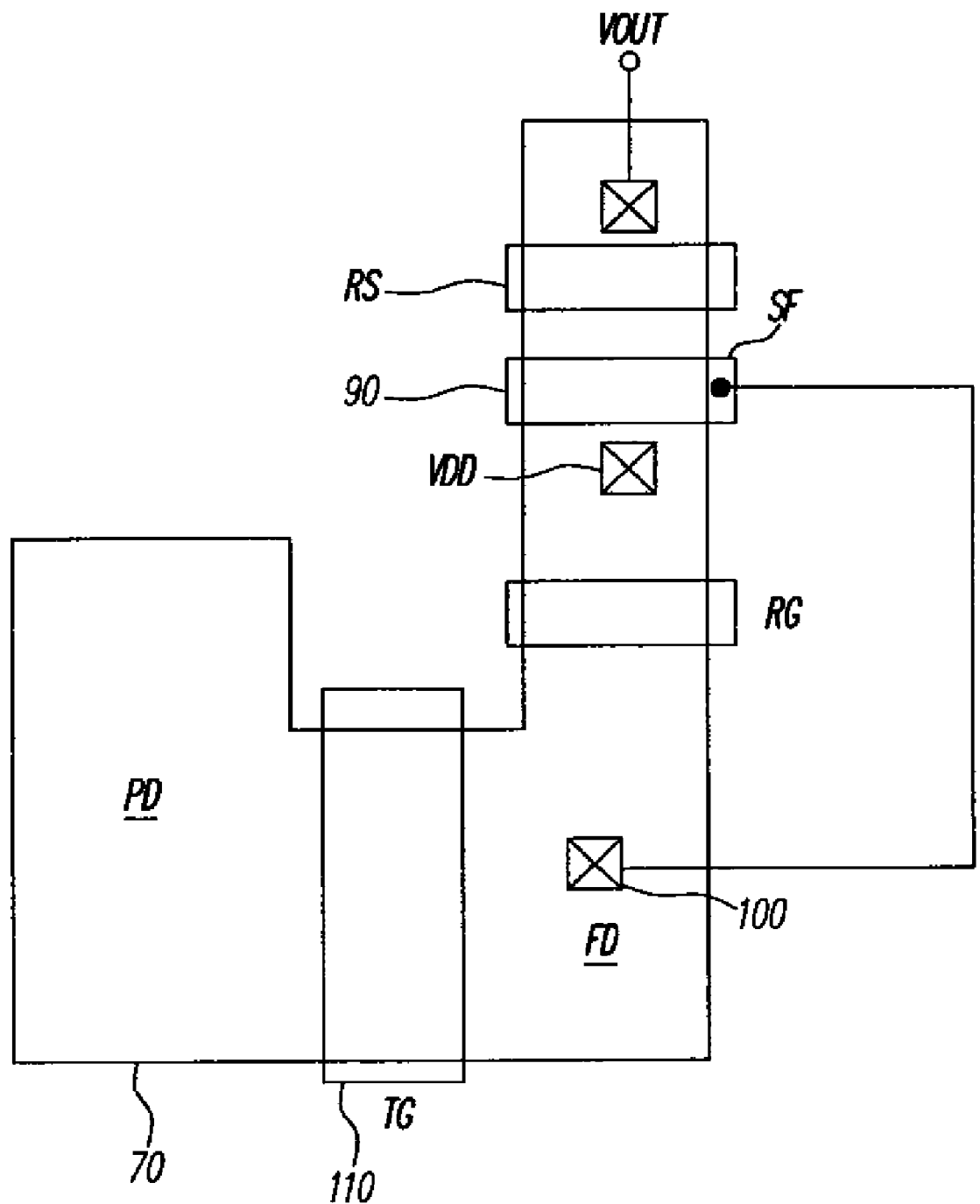
FIG. 7 is a top view of an individual pixel of an active pixel sensor of the present invention.

Referring to FIGS. 5 and 6, subsequent, an implant or a plurality of topside implants 80 are implanted to make contact with the subcollector contact region 50 (not shown in FIG. 6) of the subcollector 40 so that the subcollector 40 can be reverse biased with respect to the substrate 10. The subcollector 40 is reverse biased to drain off the carriers that could diffuse to adjacent photosites 70 thereby reducing crosstalk. Then well-known image sensor processing steps are performed to make a finished image sensor. Referring to FIG. 7, for example, active elements, such as the source follower amplifier 90, are added to the image sensor. The photosensitive sites 70 transfer charge to floating diffusion 100 (where it is converted to a voltage) via the transfer gate 110. The source follower 90 then senses the voltage for output as is well known in the art. These steps are well known in the art and will not be shown or discussed herein.

Still referring to FIG. 5, optionally in lieu of the topside implants 80, backside vias 120 can be formed through the substrate 10 to make electrical connections to the subcollector contact region 50.

The invention has been described with reference to a preferred embodiment. However, it will be appreciated that variations and modifications can be effected by a person of ordinary skill in the art without departing from the scope of the invention.

Parts List 10 p-type substrate
20 first p-type epitaxial layer
30 screening oxide layer
40 subcollector
50 subcollector contact regions
60 second epitaxial layer
70 photosensitive sites (photodiodes or photocapacitors)
80 topside implants
90 source follower amplifier
100 floating diffusion
110 transfer gate
120 backside vias
PD photodiode
TG transfer gate
FD floating diffusion
RG reset gate
VDD power supply
SF (gate of) source follower transistor
RS row select transistor
Vout output

The invention claimed is:

1. A method for making an image sensor, the method comprising:
   forming a first epitaxial layer of a first conductivity type on a substrate of the first conductivity type;
   forming a subcollector of a second conductivity type in the first epitaxial layer, wherein the second conductivity type is opposite the first conductivity type;
   forming one or more subcollector contact regions of the second conductivity type in the first epitaxial layer, wherein the one or more subcollector contact regions connect to the subcollector;
   forming a second epitaxial layer of the first conductivity type on the first epitaxial layer;
   when forming the second epitaxial layer on the first epitaxial layer, diffusing one or more dopants in the subcollector and in the one or more subcollector contact regions, wherein the dopants in the one or more subcollector contact regions diffuse at a faster rate than the one or more dopants in the subcollector so that a portion of each subcollector contact region diffuses into the second epitaxial layer; and
   forming contact regions of the second conductivity type in the second epitaxial layer, wherein each contact region connects to the portion of a respective subcollector contact region that diffused into the second epitaxial layer.

2. The method of claim 1, further comprising:
   prior to forming the subcollector in the first epitaxial layer, forming an oxide layer on the surface of the first epitaxial layer; and
   prior to forming the second epitaxial layer on the first epitaxial layer, removing the oxide layer from the surface of the first epitaxial layer.

3. The method of claim 2, wherein forming the subcollector in the first epitaxial layer comprises implanting one or more dopants of the second conductivity type into the first epitaxial layer to form the subcollector.

4. The method of claim 3, wherein forming one or more subcollector contact regions of the second conductivity type in the first epitaxial layer comprises implanting one or more dopants of the second conductivity type into the first epitaxial layer to form the one or more subcollector contact regions.

5. The method of claim 4, wherein the one or more dopants of the second conductivity type comprise one or more dopants having an n-type conductivity.

6. The method of claim 5, wherein the one or more dopants comprise one of arsenic and antimony.

7. The method of claim 1, further comprising forming a plurality of photosensitive sites of the second conductivity type in the second epitaxial layer.

8. A method for making an image sensor, the method comprising:
   forming a first epitaxial layer of a first conductivity type on a substrate of the first conductivity type;
   forming a subcollector of a second conductivity type in the first epitaxial layer, wherein the second conductivity type is opposite the first conductivity type;
   forming one or more subcollector contact regions of the second conductivity type in the first epitaxial layer, wherein the one or more subcollector contact regions connect to the subcollector; and
   forming one or more contacts through the substrate that connect to respective subcollector contact regions.

9. The method of claim 8, further comprising
   forming a second epitaxial layer of the first conductivity type on the first epitaxial layer.

10. The method of claim 9, further comprising:
prior to forming the subcollector in the first epitaxial layer, forming an oxide layer on the surface of the first epitaxial layer; and
prior to forming the second epitaxial layer on the first epitaxial layer, removing the oxide layer from the surface of the first epitaxial layer.

11. The method of claim 10, wherein forming the subcollector in the first epitaxial layer comprises implanting one or more dopants of the second conductivity type into the first epitaxial layer to form the subcollector.

12. The method of claim 11, wherein forming one or more subcollector contact regions of the second conductivity type in the first epitaxial layer comprises implanting one or more dopants of the second conductivity type into the first epitaxial layer to form the one or more subcollector contact regions.

13. The method of claim 12, wherein the one or more dopants of the second conductivity type comprise one or more dopants having an n-type conductivity.

14. The method of claim 13, wherein the one or more dopants comprise one of arsenic and antimony.

15. The method of claim 8, further comprising forming a plurality of photosensitive sites of the second conductivity type in the second epitaxial layer.

* * * * *